(12) United States Patent
Yang et al.

(10) Patent No.: US 6,538,592 B1
(45) Date of Patent: Mar. 25, 2003

(54) VARIABLE DYNAMIC RANGE ANALOG-TO-DIGITAL CONVERTER

(75) Inventors: Hong Kui Yang, San Diego, CA (US); Stash Czaja, Cardiff, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/962,630

(22) Filed: Sep. 24, 2001

(51) Int. Cl.[7] .................................. H03M 1/12
(52) U.S. Cl. ........................ 341/155; 341/143
(58) Field of Search ................. 341/155, 143

(56) References Cited

U.S. PATENT DOCUMENTS 5,982,315 A * 11/1999 Bazarjani et al. ........... 341/143
6,134,430 A * 10/2000 Younis et al. ............... 455/340
6,407,689 B1 * 6/2002 Bazarjani et al. ........... 341/143

* cited by examiner

*Primary Examiner*—Peguy JeanPierre
*Assistant Examiner*—Joseph J Lauture
(74) *Attorney, Agent, or Firm*—Mitchell Silberberg & Knupp LLP

(57) ABSTRACT

Provided is an analog-to-digital converter that includes a first analog-to-digital conversion (ADC) stage connected to input a first analog signal and a second ADC stage connected to input a second analog signal produced by the first ADC stage. A tone detector enables the second ADC stage from a disabled state when a first condition indicating the presence of a high-level interference tone is satisfied and disables the second ADC stage from an enabled state when a second condition indicating the absence of a high-level interference tone is satisfied.

28 Claims, 3 Drawing Sheets

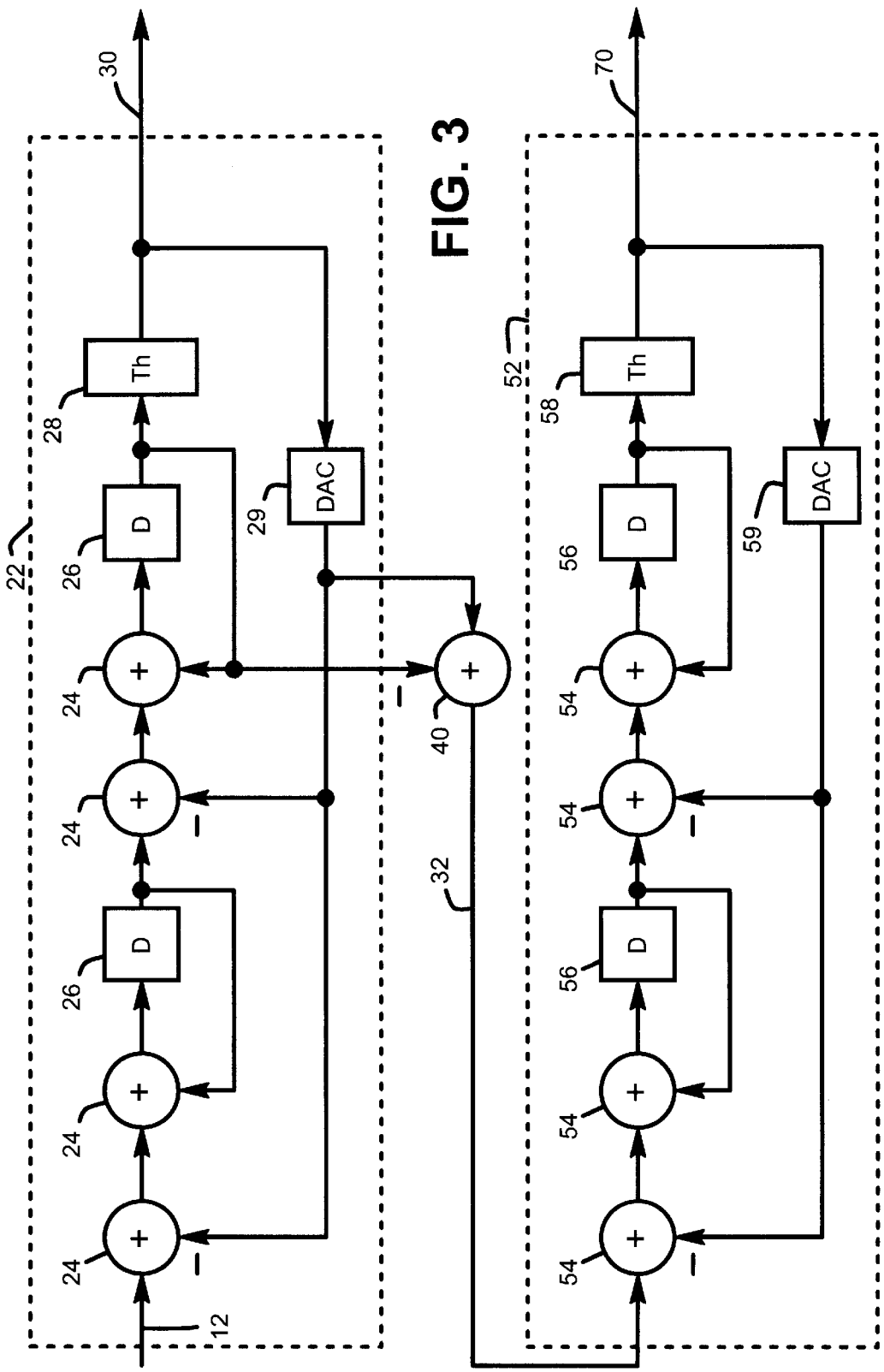

VARIABLE DYNAMIC RANGE ANALOG-TO-DIGITAL CONVERTER

BACKGROUND OF THE INVENTION

1. Field of the Invention

The present invention relates to analog-to-digital converters (ADCs), particularly ADCs for use in mobile wireless devices, such as wireless telephones.

2. Description of the Related Art

Analog-to-digital converters are used in a wide variety of applications. One such common application is in a radio receiver that is to convert analog signals to digital signals. Such digital receivers are common in the area of wireless communications.

In addition, when communicating with a wireless device there are sometimes interference tones from other sources. For example, when utilizing a wireless receiver in a code division multiple access (CDMA) system there are sometimes interference tones from nearby mobile transmitters that are operating in an Advanced Mobile Phone System (AMPS). Conventionally, these interference tones have been suppressed by using one or more analog filters before a low dynamic range ADC or by using a digital matching filter after a high dynamic range ADC. Unfortunately, both of these techniques have significant drawbacks.

As to the former technique, analog filters often can require a great deal of power and can be expensive to construct. In addition, there are often significant problems in mixing analog and digital circuitry. Thus, the latter technique has become the preferred approach. However, this technique requires that the ADC have a sufficient number of bits of resolution (or sufficient dynamic range given a fixed bit resolution requirement) to permit the digital matching filter to properly reject the interference tone regardless of the strength of the tone.

SUMMARY OF THE INVENTION

Although using a digital matching filter to reject interference tones has become the preferred technique, the present inventors have discovered that achieving the requisite dynamic range requires more power consumption than is ordinarily necessary (i.e., when only a low-level interference tone is present, which is usually the case). Thus, what is needed is an ADC that provides sufficient dynamic range when a high-level interference tone is present, but that reduces power consumption as compared to the conventional ADCs used for this purpose.

The present invention addresses this need by providing a two-stage analog-to-digital converter in which the second stage is enabled and disabled depending upon the level of the interference tone detected.

Thus, in one aspect the invention is directed to an analog-to-digital converter that includes a first analog-to-digital conversion (ADC) stage connected to input a first analog signal and a second ADC stage connected to input a second analog signal produced by the first ADC stage. A tone detector enables the second ADC stage from a disabled state when a first condition indicating the presence of a high-level interference tone is satisfied and disables the second ADC stage from an enabled state when a second condition indicating the absence of a high-level interference tone is satisfied.

In accordance with the present invention, high conversion dynamic range generally can be obtained, for example, when a high-level interference tone is detected, thereby better enabling subsequent rejection of the interference tone. At the same time, because the second stage can be disabled when such increased dynamic range is not required (e.g., when only a low-level interference tone is detected), an analog-to-digital converter according to the present invention often can minimize power consumption. Reduction of power consumption is particularly important in mobile devices (e.g., wireless telephones), which are often battery-powered.

In a more particularized aspect, the interference tone detector preferably utilizes a Fast Fourier Transform to detect the interference tone. Such an interference tone detector is believed to identify, more accurately than other technologies, whether or not a high-level interference tone in fact exists.

In a further particularized aspect, the tone detector uses a different condition to determine whether to enable the second stage than it uses to determine whether to disable the second stage. Such a technique can prevent the occurrence of a ping-pong situation, in which the ADC switches back and forth between states.

In a further particularized embodiment, the analog signal input by the second ADC stage corresponds to a measure of quantization error in the first ADC stage. In this embodiment, the output of the second ADC stage may be subtracted from the output of the first ADC stage, thereby canceling the quantization error from the first stage.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 3 is a more detailed block diagram illustrating the interconnection between the two delta-sigma-modulator stages illustrated in FIG. 1.

DESCRIPTION OF THE PREFERRED EMBODIMENT(S)

Figure 1:
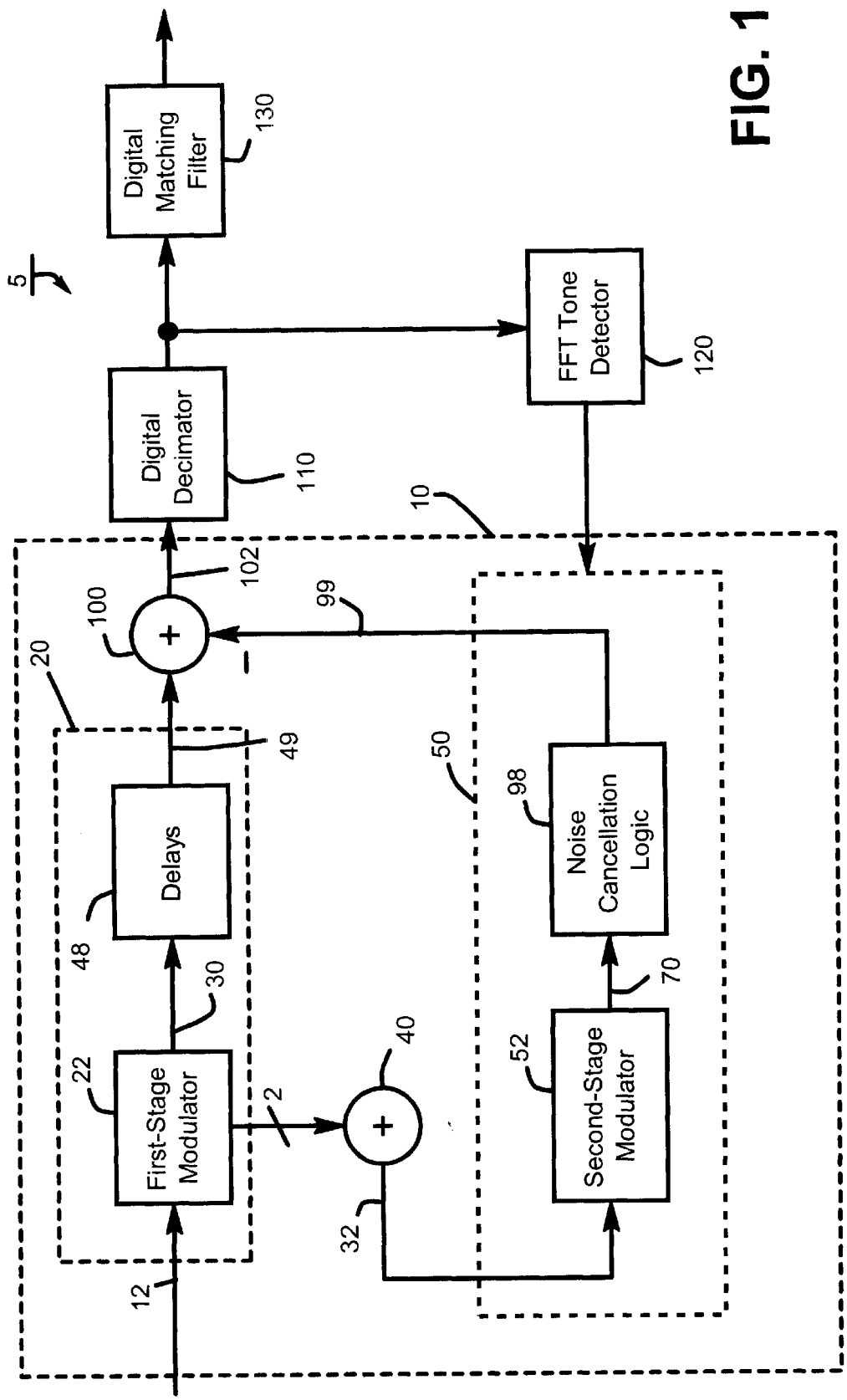
FIG. 1 is a simplified block diagram illustrating a variable-dynamic-range delta-sigma analog-to-digital converter (ADC) according to a representative embodiment of the present invention.

FIG. 1 illustrates a simplified block diagram of a variable-dynamic-range ADC 5 according to a representative embodiment of the present invention. As shown in FIG. 1, the ADC 5 includes a delta-sigma modulator 10 having a first stage 20, a second stage 50 and an adder 100. ADC 5 also includes a digital decimator 110, a FFT tone detector 120, and a digital matching filter 130. The first stage 20 of delta-sigma modulator 10 includes a first-stage delta-sigma modulator 22 and a delay element 48. The second stage 50 of delta-sigma modulator 10 includes a second-stage delta-sigma modulator 52 and a noise cancellation logic element 98.

Preferably, the first-stage delta-sigma modulator 22 is a first-order or a second-order delta-sigma modulator. The second-stage delta-sigma modulator 52 preferably is either a first-order or a second-order delta-sigma modulator. As discussed in more detail below, the second stage 50 can be disabled when a high-level interference tone is not detected, thereby reducing power consumption.

In operation, a signal 12 is input into ADC 5 (and, more specifically, into the first stage 20 of delta-sigma modulator 10), and the output of the delta-sigma modulator 10 (either using the first stage 20 only or both the first and second stages, 20 and 50, respectively, according to the then-current mode of operation, as described below) is signal 102. In the preferred embodiment of the invention, the delta-sigma modulator 10 is implemented using a conventional architecture, except that the second stage 50 can be enabled and disabled, as described in more detail below.

The output 102 of the delta-sigma modulator 10 is then decimated in digital decimator 110. The effect of digital decimator 110 is to eliminate some of the high-frequency quantization noise resulting from the delta-sigma modulator 10 and to reduce the sampling rate of the digital signal, thereby reducing the required complexity of the downstream digital-signal-processing circuitry. In the preferred embodiment of the invention, the digital decimator 110 is implemented as a cascaded integrator comb (CIC) filter. However, any other implementation may instead be used.

The output of digital decimator 110 is provided to FFT tone detector 120 and to digital matching filter 130. FFT tone detector 120 performs a Fast Fourier Transform (FFT) and then analyzes the resulting frequency bins to determine whether a high-level interference tone is present. Based on this analysis, the second stage 50 of the delta-sigma modulator 10 is either enabled, disabled, or left in its previous state (i.e., either enabled or disabled), as follows.

In the preferred embodiment of the invention, the interference tone detection is performed prior to the digital matching filter, as the digital matching filter 130 generally will reject the interference tone signal. More preferably, a FFT-based interference tone detector 120 is used, with the input signal to the interference tone detector being a decimated version of the delta-sigma modulated signal.

FFT interference tone detection is preferred over power detection because the quantization noise floor of the delta-sigma modulator often is still high at high frequencies (and hence the noise power is high) even after digital decimation in decimator 110. This is particularly true when such decimation is performed using a CIC filter, as in the preferred embodiment of the invention. In such a case, power detection generally will include such quantization noise and therefore will limit the detection accuracy. FFT interference tone detection, on the other hand, generally can distinguish between such high-frequency quantization noise and a high-level interference tone. To save FFT computation and to reduce the required memory size, the samples at the decimator 110 output preferably are further decimated to the Nyquist rate (i.e., twice the signal bandwidth) FFT interference tone detection in the preferred embodiment of the invention involves performing a FFT on collected samples, identifying the frequency bin that has the greatest power, and then calculating a ratio of the power for that bin to the total power over all of the FFT bins (i.e., the total power of the signal). By comparing this ratio to (preferably fixed) thresholds, a determination can be made as to whether a high-level interference tone is present.

Two situations are considered: (1) when the modulator is configured to the lower order (i.e., the first stage 20 only) and, in this case, switching to the higher order (i.e., enabling the second stage 50) is required when a tone is identified; and (2) when the modulator is configured to the higher order, the removal of the strong tone might, absent compensating measures, cause the modulator to switch from the higher order to the lower order.

In order to prevent such a ping-pong situation, a hysteresis is utilized in the preferred embodiment of the invention. Such a hysteresis involves utilizing different thresholds depending upon the state in which the delta-sigma modulator currently is operating. This is illustrated in FIG. 2.

Figure 2:
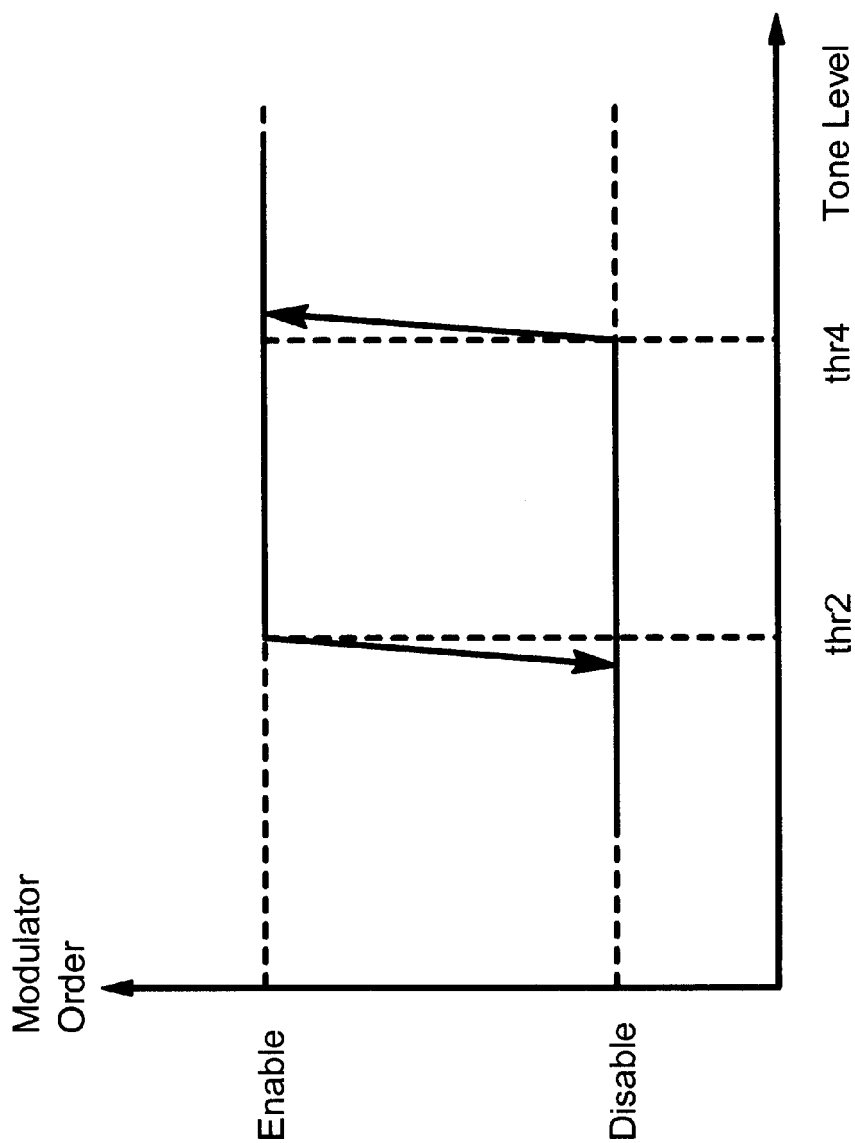
FIG. 2 is a graph illustrating the enable and disable thresholds which may be used by a variable-dynamic-range ADC according to the present invention.

As shown in FIG. 2, FFT tone detector 120 causes the delta-sigma modulator to transition from a state in which second-stage 50 is disabled to one in which second-stage 50 is enabled if the ratio described above meets or exceeds a threshold thr4. FFT tone detector 120 causes the delta-sigma modulator to transition from a state in which the second-stage 50 is enabled to one in which it is disabled when the power ratio is less than or equal to a threshold thr2, where thr2 is less than thr4. In all other situations, FFT tone detector 120 leaves the delta-sigma modulator in its previous state.

In the preferred embodiment of the present invention, the system parameters are as follows: (i) both of the first-stage modulator 22 and the second stage modulator 52 are second-order delta-sigma modulators; (ii) the delta-sigma modulator 10 (whether using a single stage or both stages) over-samples at a rate of $32f_c$ (where $f_c$ is the chip rate in a CDMA system); (iii) digital decimator 110 then decimates that output to $8f_c$; (iv) prior to performing FFT processing, FFT tone detector 120 performs simple decimation to a rate of $f_c$ and also truncates each sample to 8 bits; and (v) FFT tone detector 120 then performs FFT processing on blocks of 64 samples for each desired channel (e.g., I and Q). As noted above, in the preferred embodiment of the invention, FFT tone detector 120 determines whether to transition from a state in which the second-stage 50 is disabled to one in which it is enabled, and vice-versa, by comparing the maximum bin power to the total power across all FFT bins.

Given the system parameters specified in the preceding paragraph, thr4 preferably is set equal to −6 decibels (dB), and thr2 preferably is set equal to (thr4 −$L_h$−$L_d$), where $L_h$ is the hysteresis delay (e.g., 6dB) and $L_d$ is the dynamic-range difference between the first-stage modulator and a cascaded a cascaded first-stage and second-stage delta-sigma modulator (e.g., 12dB). However, it should be understood that the specific thresholds used will depend upon a number of different system parameters, such as the types of modulators used, the orders of the modulators and the number of FFT samples processed.

Returning to FIG. 1, when second stage 50 is enabled, a signal 32 from first-stage delta-sigma modulator 22 (actually, as illustrated in FIG. 1, the combination of two signals from modulator 22) is provided to the input of second-stage delta-sigma modulator 52. This signal 32 preferably represents the quantization error of first-stage delta-sigma modulator 22. This quantization error signal 32 is itself quantized in second-stage delta-sigma modulator 52 and then is subjected to noise cancellation processing in element 98. Such noise cancellation may be implemented, for example, in any manner conventionally used in cascaded two-stage delta-sigma modulators.

With reference now to the first stage 20, the output of first-stage delta-sigma modulator 22 is provided to delay element 48. Delay element 48 provides a delay that corresponds to the delay introduced by noise cancellation logic 98. The output of noise cancellation logic 98 is then subtracted from the output of delay element 48 in adder 100.

Thus, with second stage 50 enabled, a quantization noise estimate from first-stage delta-sigma modulator 22 is itself quantized in second stage 50 and then is subtracted from the output of first-stage delta-sigma modulator 22, thereby reducing the quantization noise from first stage 20. In short, when FFT tone detector 120 enables second stage 50, the combination of first stage 20, second stage 50 and adder 100 functions exactly the same as many conventional cascaded two-stage delta-sigma modulators.

When second stage 50 is disabled by FFT tone detector 120, the output of first-stage delta-sigma modulator 22 may be provided directly to digital decimator 110. Alternatively, the output of first-stage delta-sigma modulator 22 in this case instead may be provided to digital decimator 110 through delay element 48 and adder 100, with the output signal 99 of second stage 50 forced to zero.

As noted above, the output of digital decimator 110 also is provided to digital matching filter 130. In digital matching filter 130, most of the remaining high-frequency quantization noise is filtered out; the interference tone, if any, also is filtered out; and the digital signal is further decimated down to the desired sampling frequency, $f_s$. Digital matching filter 130 may be implemented, for example, using any conventional architecture.

FIG. 3 illustrates in more detail the interconnection between first-stage delta-sigma modulator 22 and second-stage delta-sigma modulator 52 in the present embodiment of the invention. As shown in FIG. 3, modulator 22 includes adders 24, single-sample delay elements 26, threshold detector 28, and digital-to-analog converter (DAC) 29. Similarly, modulator 22 includes adders 54, single-sample delay elements 56, threshold detector 58, and digital-to-analog converter 59. Although threshold detectors 28 and 58 are used in modulators 22 and 52, respectively (resulting in one-bit quantization), it should be understood that multi-bit quantization (with a corresponding multi-bit DAC 29 or 59, respectively) may instead be performed in either or both of modulator 22 and modulator 52, subject to the stability and linearity considerations known to those skilled in the art.

The output 30 of delta-sigma modulator 22 is converted back into an analog signal in digital-to-analog converter 29 and, from this analog signal, the non-quantized analog signal (i.e., the input to threshold detector 28) is subtracted in adder 40. The resulting output 32 represents the quantization error of delta-sigma modulator 22 and is provided to the input of delta-sigma modulator 52. It is noted that although adder 40 is shown to be external to modulator 22 in FIGS. 1 and 3, adder 40 may optionally be considered to be included within (i.e., a part of) delta-sigma modulator 22.

The foregoing arrangement is based on the recognition that high signal-to-quantization-noise for a receiver ADC generally is required only when there is a strong interference tone (e.g. from an AMPS signal) present nearby the CDMA channel frequency. Absent such an interference tone, a lower dynamic-range ADC typically is sufficient. As a result, the ADC according to the present invention has variable dynamic range to account for these different situations. More specifically, the present invention functions by enabling and disabling a second stage of the ADC as necessary. In the preferred embodiment of the invention, each stage includes a delta-sigma modulator. In order to determine which order of delta-sigma modulator is used in the receiver system (i.e., whether the second stage is enabled or not), an interference tone detector (preferably a FFT-based detector) is used. This detector then configures the ADC to an appropriate order.

Alternative Environment

In addition to the hardware implementations described above, any of the digital signal processing methods and techniques described herein also can be practiced with a general-purpose computer system. Such a computer typically will include, for example, at least some of the following components: one or more central processing units (CPUs), read-only memory (ROM), random access memory (RAM), input/output circuitry for interfacing with other devices and for connecting to one or more networks (which in turn may connect to the Internet or to any other networks), a display (such as a cathode ray tube or liquid crystal display), other output devices (such as a speaker or printer), one or more input devices (such as a mouse or other pointing device, keyboard, microphone or scanner), a mass storage unit (such as a hard disk drive), a real-time clock, a removable storage read/write device (such as for reading from and/or writing to a magnetic disk, a magnetic tape, an opto-magnetic disk, an optical disk, or the like), and a modem (which also may connect to the Internet or to any other computer network via a dial-up connection). In operation, the process steps to implement the above digital signal processing methods typically are initially stored in mass storage (e.g., the hard disk), are downloaded into RAM and then executed by the CPU out of RAM.

Suitable computers for use in implementing the present invention may be obtained from various vendors. Various types of computers, however, may be used depending upon the size and complexity of the tasks. Suitable computers include mainframe computers, multiprocessor computers, workstations, personal computers, and even smaller computers such as PDAs, wireless telephones or any other networked appliance or device. In addition, although a general-purpose computer system has been described above, a special-purpose computer may also be used. In particular, any of the functionality described above can be implemented in software, hardware, firmware or any combination of these, with the particular implementation being selected based on known engineering tradeoffs.

It should be understood that the present invention also relates to machine-readable media on which are stored program instructions for performing the methods of this invention. Such media include, by way of example, magnetic disks, magnetic tape, optically readable media such as CD ROMs and DVD ROMs, semiconductor memory such as PCMCIA cards, etc. In each case, the medium may take the form of a portable item such as a small disk, diskette, cassette, etc., or it may take the form of a relatively larger or immobile item such as a hard disk drive, ROM or RAM provided in a computer.

Additional Considerations

In the foregoing embodiment, each stage of the ADC includes a delta-sigma modulator. However, any other type of modulator or converter, such as a delta modulator, or a pipeline, flash or algorithmic converter with a multi-stage structure in which a later stage provides increased conversion dynamic range may be substituted for the two-stage delta-sigma modulator described above.

Similarly, as well-understood in the art, different types of digital decimators may be substituted for the CIC decimator described above. Also, any other frequency-domain analysis technique (such as a technique based on a discrete cosine transformation), or even non-frequency-domain techniques (such as the power detection method mentioned above), may be used in place of the FFT tone detection technique described above.

Still further, in the foregoing embodiment the tone detector tests the output of the digital decimator 110. While this arrangement is preferred, it is not critical. Instead, the tone detector may analyze the signal soon after it is converted into a digital format (e.g., prior to decimator 110 or even prior to adder 100, at or near the output of first-stage modulator 22). The interference tone detector may even be configured so as to analyze the signal while still in analog format (e.g., particularly if the tone detector checks for a high-level interference tone based on power). However, most of these alternative interference tone detection techniques are believed to be inferior to FFT-based interference tone detection, as described above, in terms of complexity, power consumption and/or accuracy.

Another benefit of using FFT-based interference tone detection is that the frequency of the interference tone is identified simultaneously with its power. This information may be useful in helping to eliminate the interference tone in alternative embodiments of the invention, such as by modifying the filter parameters of digital matching filter 130 based on the identified frequency. In addition, or instead, the enabling or disabling condition (e.g., one or both thresholds) may be set based at least in part on the identified frequency; such a technique might be utilized, for example, in order to compensate for any frequency response non-uniformity of the digital matching filter 130.

It should also be noted that the present invention is not limited to two stages. Instead, the concepts described herein may be applied to construct a variable-dynamic-range ADC with any number of stages. When more than two stages are involved, the tone detector may be configured to enable/disable one or more stages based on the identified strength and/or the frequency of the interference tone, if any.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

Also, several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

What is claimed is:

1. An analog-to-digital converter, comprising:
    a first analog-to-digital conversion (ADC) stage connected to input a first analog signal and convert the first analog signal to a first digital signal;
    a second ADC stage connected to input a second analog signal and convert the second analog signal to a second digital signal, wherein the second analog signal has been generated by converting the first digital signal back into an analog signal and comparing said analog signal to the first analog signal; and
    a tone detector that enables the second ADC stage from a disabled state when a first condition indicating presence of a high-level interference tone is satisfied and disables the second ADC stage from an enabled state when a second condition indicating absence of a high-level interference tone is satisfied.

2. An analog-to-digital converter according to claim 1, wherein each of the first ADC stage and the second ADC stage comprises a delta-sigma modulator.

3. An analog-to-digital converter according to claim 1, wherein the first ADC stage comprises a second-order delta-sigma modulator.

4. An analog-to-digital converter according to claim 1, wherein the tone detector utilizes a Fast Fourier Transform to detect the high-level interference tone.

5. An analog-to-digital converter according to claim 1, further comprising a subtractor that subtracts an output of the second ADC stage, if enabled, from an output of the first ADC stage to provide a sampled output.

6. An analog-to-digital converter according to claim 5, further comprising a decimator that reduces a sampling frequency of the sampled output so as to provide a decimated output.

7. An analog-to-digital converter according to claim 6, wherein the tone detector tests the decimated output for presence of the high-level interference tone.

8. An analog-to-digital converter according to claim 6, further comprising a digital matching filter that filters the decimated output so as to reject the high-level interference tone.

9. An analog-to-digital converter according to claim 1, wherein the first condition is different than the second condition.

10. An analog-to-digital converter according to claim 1, wherein the first condition indicating presence of the high-level interference tone includes comparing a measured indication of tone power to a first threshold, and wherein the second condition indicating absence of the high-level interference tone includes comparing the measured indication of tone power to a second threshold that is lower than the first threshold.

11. An analog-to-digital converter according to claim 1, wherein enabling the second ADC stage results in better dynamic range.

12. An analog-to-digital converter according to claim 1, wherein said analog-to-digital converter is incorporated into a receiver in a wireless telephone.

13. An analog-to-digital converter according to claim 1, wherein the tone detector uses a frequency-domain analysis technique to determine whether the high-level interference tone is present.

14. An analog-to-digital converter according to claim 1, wherein the tone detector is implemented after the first ADC stage.

15. An analog-to-digital converter, comprising:
    first analog-to-digital conversion (ADC) means for inputting a first analog signal and for converting the first analog signal to a first digital signal;
    second ADC means for inputting a second analog signal and for converting the second analog signal to a second digital signal, wherein the second analog signal has been generated by converting the first digital signal back into an analog signal and comparing said analog signal to the first analog signal; and
    tone detection means for enabling the second ADC means from a disabled state when a first condition indicating presence of a high-level interference tone is satisfied and disables the second ADC means from an enabled state when a second condition indicating absence of a high-level interference tone is satisfied.

16. An analog-to-digital converter according to claim 15, wherein each of the first ADC means and the second ADC means comprises a delta-sigma modulator.

17. An analog-to-digital converter according to claim 15, wherein the first ADC means comprises a second-order delta-sigma modulator.

18. An analog-to-digital converter according to claim 15, wherein the tone detection means utilizes a Fast Fourier Transform to detect the high-level interference tone.

19. An analog-to-digital converter according to claim 15, further comprising subtraction means for subtracting an output of the second ADC means, if enabled, from an output of the first ADC means to provide a sampled output.

20. An analog-to-digital converter according to claim 19, further comprising decimation means for reducing a sampling frequency of the sampled output so as to provide a decimated output.

21. An analog-to-digital converter according to claim 20, wherein the tone detection means tests the decimated output for presence of the high-level interference tone.

22. An analog-to-digital converter according to claim 20, further comprising digital matching filter means for filtering the decimated output so as to reject the high-level interference tone.

23. An analog-to-digital converter according to claim 15, wherein the first condition is different than the second condition.

24. An analog-to-digital converter according to claim 15, wherein the first condition indicating presence of the high-level interference tone includes comparing a measured indication of tone power to a first threshold, and wherein the second condition indicating absence of the high-level interference tone includes comparing the measured indication of tone power to a second threshold that is lower than the first threshold.

25. An analog-to-digital converter according to claim 15, wherein enabling the second ADC means results in better dynamic range.

26. An analog-to-digital converter according to claim 15, wherein said analog-to-digital converter is incorporated into a receiver in a wireless telephone.

27. An analog-to-digital converter according to claim 15, wherein the tone detection means uses a frequency-domain analysis technique to determine whether the high-level interference tone is present.

28. An analog-to-digital converter according to claim 15, wherein the tone detection means is implemented after the first ADC means.

* * * * *